United States Patent
Yang et al.

(10) Patent No.: US 9,159,591 B2
(45) Date of Patent: Oct. 13, 2015

(54) BATCH TYPE APPARATUS FOR MANUFACTURING SEMICONDUCTOR DEVICES

(75) Inventors: Cheol-Kyu Yang, Suwon-si (KR);
Seog-Min Lee, Suwon-si (KR);
Chul-Young Jang, Hwaseong-si (KR);
Dong-Min Son, Incheon (KR);
Byung-Ho Ahn, Hwaseong-si (KR);
Du-Han Jeon, Yongin-si (KR);
Yong-Kyu Joo, Hwaseong-si (KR);
Sang-Cheol Ha, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 540 days.

(21) Appl. No.: 13/614,321

(22) Filed: Sep. 13, 2012

(65) Prior Publication Data
US 2013/0167774 A1 Jul. 4, 2013

(30) Foreign Application Priority Data
Jan. 3, 2012 (KR) .................. 10-2012-0000357

(51) Int. Cl.
*H01L 21/67* (2006.01)
*C23C 16/455* (2006.01)

(52) U.S. Cl.
CPC ........ *H01L 21/67017* (2013.01); *C23C 16/455* (2013.01); *C23C 16/45563* (2013.01); *C23C 16/45568* (2013.01); *C23C 16/45578* (2013.01); *C23C 16/45587* (2013.01); *H01L 21/67109* (2013.01)

(58) Field of Classification Search
CPC .............. C23C 16/45563; C23C 16/45568; C23C 16/45578; C23C 16/45583; C23C 16/45587; C23C 16/455

USPC ...................... 118/715; 156/345.33
See application file for complete search history.

(56) References Cited

U.S. PATENT DOCUMENTS

| 5,318,633 | A  | * | 6/1994  | Yamamoto et al. ........... 118/725 |
| 5,441,570 | A  | * | 8/1995  | Hwang ........................ 118/725 |
| 5,777,300 | A  |   | 7/1998  | Homma et al. |
| 6,488,775 | B2 |   | 12/2002 | Shimizu et al. |
| 6,881,295 | B2 | * | 4/2005  | Nagakura ................ 156/345.33 |
| 7,900,580 | B2 | * | 3/2011  | Kontani et al. ........... 118/723 E |
| 8,002,895 | B2 | * | 8/2011  | Inoue et al. .................... 118/715 |
| 8,070,880 | B2 | * | 12/2011 | Marubayashi et al. ....... 118/719 |

(Continued)

FOREIGN PATENT DOCUMENTS

| JP | 2008-227163   | 9/2008 |
| KR | 10-2007-0006462 A | 1/2007 |

(Continued)

*Primary Examiner* — Rudy Zervigon
(74) *Attorney, Agent, or Firm* — Myers Bigel Sibley & Sajovec

(57) ABSTRACT

A batch type apparatus may include a tube; a boat configured to receive a plurality of semiconductor substrates, the boat vertically moved into the tube; a gas nozzle vertically arranged in the tube, the tube having a first portion and a second portion upwardly extended from the first portion; a gas pipe for supplying reaction gases to the gas nozzle, the gas pipe having a horizontal extension and a vertical extension, and the vertical extension extended in the gas nozzle; a fixing member for fixing the first portion of the gas nozzle to the gas pipe, the fixing member having strength higher than that of the gas nozzle; and a clamping member for clamping the gas pipe to the tube. Therefore, breakage of the gas nozzle may be suppressed.

20 Claims, 9 Drawing Sheets

(56) References Cited

U.S. PATENT DOCUMENTS

| | | | |
|---|---|---|---|
| 8,075,692 B2* | 12/2011 | Osborne et al. | 118/715 |
| 8,251,012 B2* | 8/2012 | Ishimaru | 118/723 E |
| 8,343,277 B2* | 1/2013 | Takebayashi et al. | 118/715 |
| 2002/0017241 A1 | 2/2002 | Shimizu et al. | |
| 2008/0190910 A1 | 8/2008 | Shimada et al. | |
| 2009/0116936 A1* | 5/2009 | Marubayashi et al. | 414/148 |
| 2009/0205783 A1* | 8/2009 | Tanabe et al. | 156/345.37 |
| 2010/0212593 A1* | 8/2010 | Takebayashi et al. | 118/725 |
| 2011/0139319 A1 | 6/2011 | Kobayashi | |

FOREIGN PATENT DOCUMENTS

| | | |
|---|---|---|
| KR | 10-2007-0039694 A | 4/2007 |
| KR | 10-0789251 B1 | 12/2007 |
| KR | 10-2008-0056428 A | 6/2008 |
| KR | 10-2009-0061305 A | 6/2009 |

* cited by examiner

ND DEVICES

REFERENCE TO PRIORITY APPLICATION

This application claims priority to Korean Patent Application No. 10-2012-0000357, filed Jan. 3, 2012, the contents of which are hereby incorporated herein by reference in its entirety.

FIELD

This invention relates to batch type apparatuses for manufacturing semiconductor devices. More particularly, example embodiments relate to batch type apparatuses for manufacturing semiconductor devices that may include gas nozzles in process tubes.

BACKGROUND

A batch type apparatus may be used for manufacturing a semiconductor device. The batch type apparatus may include a tube configured to receive a plurality of semiconductor substrates. Reaction gases may be applied to the semiconductor substrates. The reaction gases may be introduced into the tube through a vertical gas nozzle.

However, it may be difficult to install a gas nozzle in a batch type apparatus. Further, a gas nozzle may become broken during installation. Furthermore, because the reaction gases may be continuously introduced into a gas nozzle at a high temperature, high stresses may be applied to the gas nozzle, so that cracks may be generated in the gas nozzle.

SUMMARY

Example embodiments provide a batch type apparatus for manufacturing a semiconductor device that may be capable of readily installing a gas nozzle and suppressing damage to the gas nozzle.

According to some example embodiments, there is provided a batch type apparatus for manufacturing a semiconductor device. The batch type apparatus comprises a tube; a boat configured to receive a plurality of semiconductor substrates, the boat vertically moved into the tube; a gas nozzle vertically arranged in the tube, the tube having a first portion and a second portion upwardly extended from the first portion; a gas pipe for supplying reaction gases to the gas nozzle, the gas pipe having a horizontal extension and a vertical extension, and the vertical extension extended in the gas nozzle; a fixing member for fixing the first portion of the gas nozzle to the gas pipe, the fixing member having strength higher than that of the gas nozzle; and a clamping member for clamping the gas pipe to the tube.

In example embodiments, the first portion of the gas nozzle may have a cross-sectional area to prevent a gap between the gas nozzle and the fixing member from being formed.

In example embodiments, the first portion may have a cross-sectional area smaller than that of the second portion.

In example embodiments, the first portion may have a first hole, and the second portion has a second hole with a diameter larger than that of the first hole.

In example embodiments, the first hole may have a diameter to prevent a gap between the first hole and the gas pipe from being formed.

In example embodiments, the gas pipe may have an upper end higher than a lower surface of the second portion of the gas nozzle to directly supply the reaction gases to the second portion.

In example embodiments, the fixing member may include a connecting pipe configured to receive the gas nozzle; and a fixing portion for fixing the gas nozzle to the connecting pipe.

In example embodiments, the gas nozzle may have a sliding protrusion formed at a lower sidewall of the gas nozzle, and the connecting pipe has a sliding groove into which the sliding protrusion is inserted.

In example embodiments, the fixing portion may include a fixing cap having a ring and a protrusion, the ring configured to surround the gas nozzle, and the protrusion inserted into the sliding groove.

In example embodiments, the fixing portion may include a fixing clip configured to surround the second portion of the gas nozzle.

In example embodiments, the fixing member may include a nickel alloy, a stainless steel, an iron-nickel alloy, an iron-nickel-cobalt alloy, etc.

In example embodiments, the gas pipe may include a metal alloy having strength higher than that of the gas nozzle.

In example embodiments, the gas pipe may include a nickel alloy, a stainless steel, an iron-nickel alloy, an iron-nickel-cobalt alloy, etc.

In example embodiments, the gas nozzle may include quartz, silicon carbide (SiC), etc.

In example embodiments, the clamping member may include a flange combined with the horizontal extension of the gas pipe and a bolt for fixing the gas pipe.

According to some embodiments, a gas nozzle assembly for a semiconductor manufacturing apparatus includes an elongated gas nozzle having a first portion and a second portion, and a fixing member that is configured to attach the gas nozzle first portion to a gas pipe. A first passageway extends axially through the gas nozzle first portion and a second passageway extends axially through the gas nozzle second portion and is in fluid communication with the first passageway. The first passageway has an inside diameter that is smaller than an inside diameter of the second passageway. The gas pipe has a free end that extends into the second passageway of the gas nozzle.

In some embodiments, the fixing member includes a connecting member having an internal passageway that is configured to receive the gas nozzle first portion therein.

In some embodiments, the gas nozzle includes a locking member extending outwardly from a sidewall thereof. The fixing member includes a groove formed therein that is configured to slidably receive the gas nozzle locking member therein for securing the gas nozzle to the connecting member. The fixing member also includes a member that is configured to extend at least partially around the gas nozzle and to cooperate with the fixing member groove to prevent the locking member from movement within the groove.

According to example embodiments, the gas pipe and the fixing member at the bent portion may include the metal alloy having high strength. As mentioned above, a fixing portion by the clamping member may be the sidewall of the gas pipe, not the gas nozzle. Therefore, breakage of the gas nozzle may be suppressed. Further, an exchange period of the gas nozzle may be elongated, so that a cost for maintaining the batch type apparatus and process failures may be reduced.

BRIEF DESCRIPTION OF THE DRAWINGS

Example embodiments will be more clearly understood from the following detailed description taken in conjunction with the accompanying drawings. FIGS. 1 to 4C represent non-limiting, example embodiments as described herein.

FIG. 1 is a perspective view illustrating a batch type apparatus for manufacturing a semiconductor device in accordance with example embodiments;

FIG. 3 is a cross-sectional view illustrating the gas nozzle, the fixing member and the gas pipe installed at the apparatus in FIG. 1;

FIGS. 4B and 4C are perspective views illustrating the gas nozzle, the fixing member and the gas pipe in FIG. 4A.

DETAILED DESCRIPTION OF THE EMBODIMENTS

Figure 1:
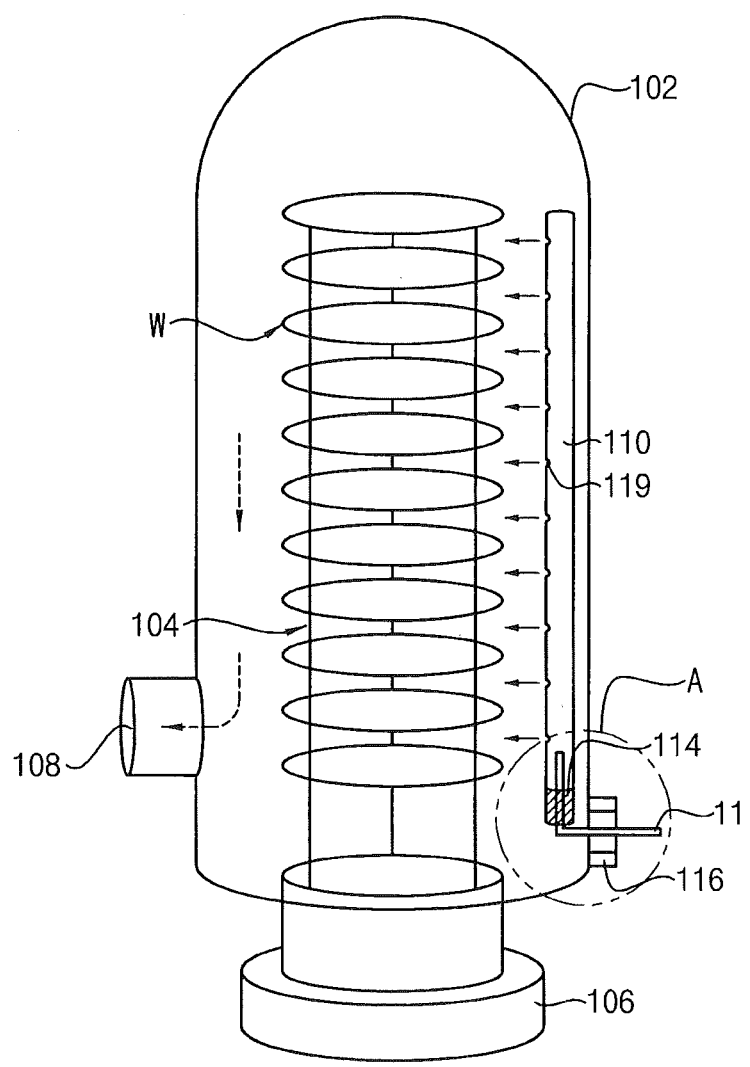

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a perspective view illustrating a batch type apparatus for manufacturing a semiconductor device in accordance with example embodiments.

Referring to FIG. 1, a batch type apparatus 100 for manufacturing a semiconductor device may include a tube 102, a boat 104, a boat cap 106, a gas outlet 108, a gas nozzle 110, a gas pipe 112, a fixing member 114 and a clamping member 116.

In example embodiments, the tube 102 may include a cylindrical furnace. The tube 102 may include quartz. Processes for manufacturing the semiconductor device may be performed in the tube 102. Further, the tube 102 may include only an outer tube. Alternatively, the tube 102 may include an inner tube and an outer tube.

In example embodiments, the boat 104 may be configured to receive a plurality of semiconductor substrates W. The boat 104 may transfer the semiconductor substrates W into the tube 102. The boat 104 may be vertically moved from a lower end of the tube 102 into the tube 102.

The boat cap 106 may be installed at a lower surface of the boat 104. The boat cap 105 may seal the lower end of the tube 102 when the boat 104 may be located in the tube 102.

Reaction gases in the tube 102 may be emitted through the gas outlet 108. In example embodiments, the gas outlet 108 may be arranged at a side surface of the tube 102.

The gas nozzle 110 may be combined with the fixing member 114. The gas nozzle 110 with the fixing member 114 may be installed in the tube 102. The gas nozzle 110 may spray the reaction gases into the tube 102. The reaction gases may then be applied to the semiconductor substrates W. In example embodiments, the gas nozzle 110 may uniformly provide surfaces of the semiconductor substrates W in the boat 104 with the reaction gases. The gas nozzle 110 may have a cylindrical shape vertically erected on the lower surface of the tube 102. Gas-spraying holes 119 may be formed through a side surface of the gas nozzle 110.

The fixing member 114 may be combined with a lower end of the gas nozzle 110 to support the lower end of the gas nozzle 110.

The gas pipe 112 may be connected between the gas nozzle 110 and a gas tank (not shown). The gas pipe 112 may be configured to penetrate the gas nozzle 110 and the fixing member 114 combined with the gas nozzle 110.

The clamping member 116 may clamp the gas nozzle 110 to the tube 102. The clamping member 116 may not be directly fixed to the gas nozzle 110. The clamping member 116 may be combined with a horizontal extension of the gas pipe 112. In example embodiments, the clamping member 116 may include a flange and a bolt. The clamping member 116 may be located under a bent portion of the gas pipe 112 to fix the lower end of the gas pipe 112.

Figure 2A:
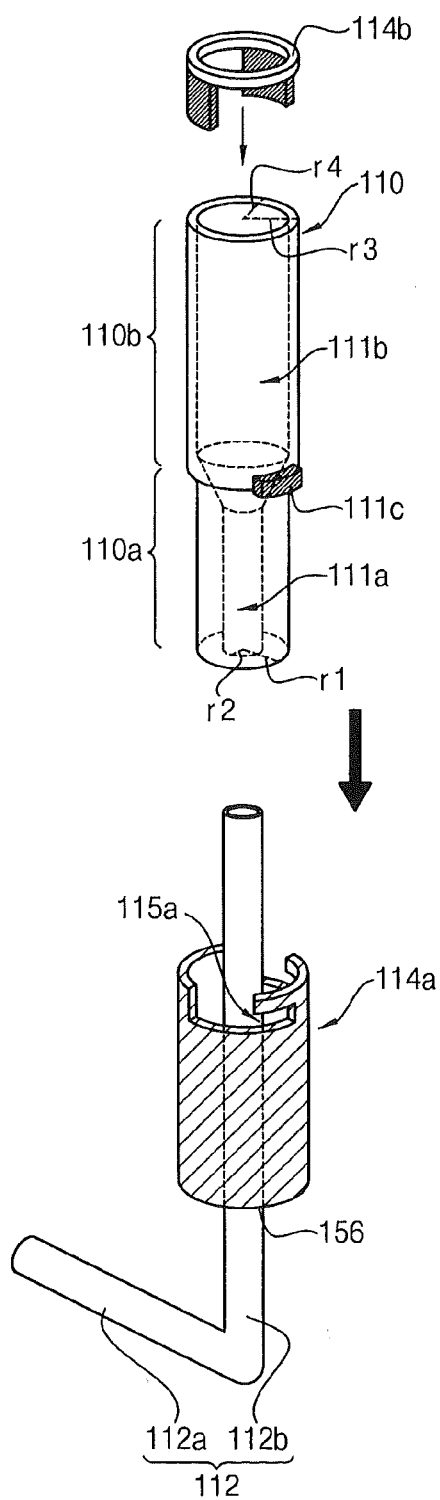
FIG. 2A is an exploded perspective view illustrating a gas nozzle, a fixing member and a gas pipe of the batch type apparatus in FIG. 1.
Figure 2B:
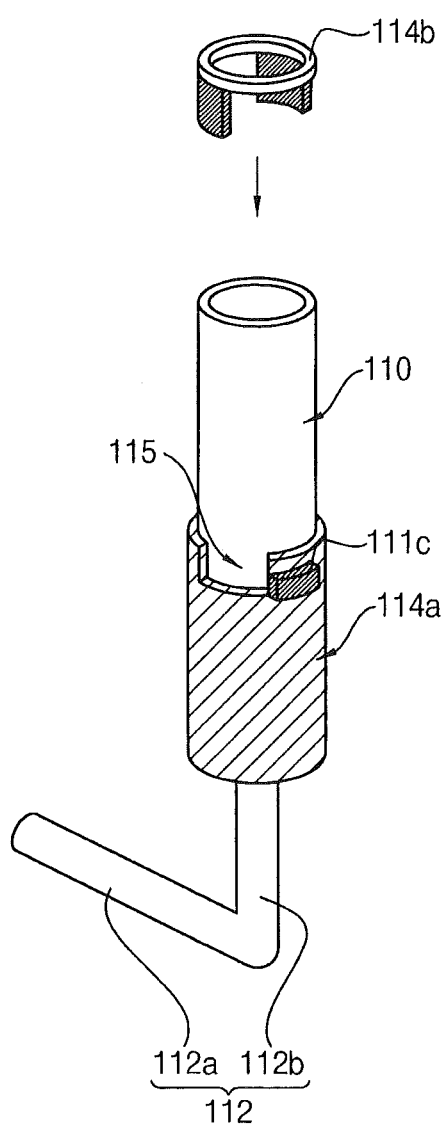
FIGS. 2B and 2C are perspective views illustrating the gas nozzle, the fixing member and the gas pipe in FIG. 2A.
Figure 2C:
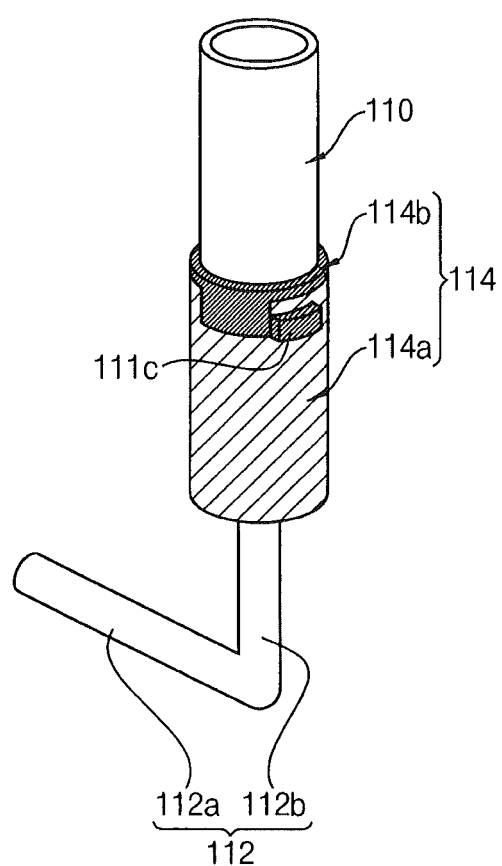
Figure 2D:
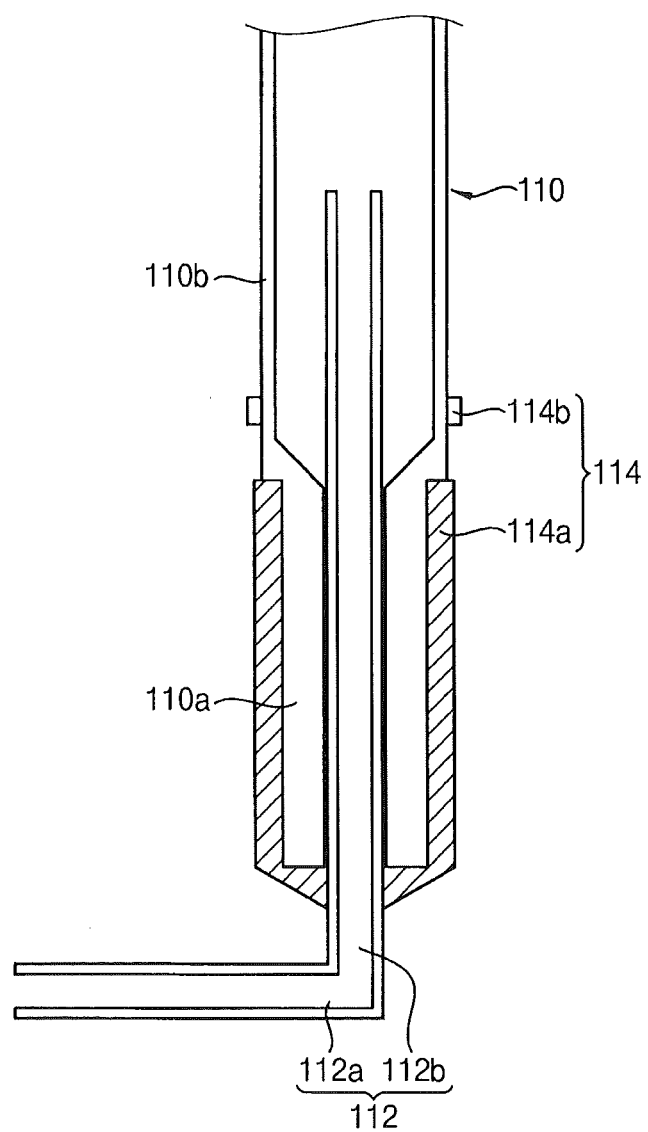
FIG. 2D is a cross-sectional view illustrating the gas nozzle, the fixing member and the gas pipe in FIG. 2A.

FIG. 2A is an exploded perspective view illustrating a gas nozzle, a fixing member and a gas pipe of the batch type apparatus in FIG. 1, FIGS. 2B and 2C are perspective views illustrating the gas nozzle, the fixing member and the gas pipe in FIG. 2A, and FIG. 2D is a cross-sectional view illustrating the gas nozzle, the fixing member and the gas pipe in FIG. 2A. FIGS. 2A to 2D show a portion "A' in FIG. 1;

Referring to FIGS. 2A to 2D, the gas nozzle 110 may have a cylindrical shape in which a hole may be formed. The gas nozzle 110 may have a linear shape, not a bent portion.

In example embodiments, the gas nozzle 110 may have a first portion 110a inserted into a connecting pipe 114a of the fixing member 114 (See FIG. 1), and a second portion 110b protruded from the connecting pipe 114a. That is, the first portion 110a of the gas nozzle 110 may correspond to a lower portion of the gas nozzle 110. The second portion 110b of the gas nozzle 110 may correspond to an upper portion of the gas nozzle 110. The first portion 110a of the gas nozzle 110 may have an outer diameter r1 different from an outer diameter r3 of the second portion 110b of the gas nozzle 110. Further, the first portion 110a of the gas nozzle 110 may have an inner diameter r2 different from an inner diameter r4 of the second portion 110b of the gas nozzle 110.

In example embodiments, the first portion 110a may be inserted into the connecting pipe 114a of the fixing member 114. Thus, the outer diameter r1 of the first portion 110a may be shorter than the outer diameter r3 of the second portion 110b. When a gap may be formed between the first portion 110a and the connecting pipe 114a, the reaction gases may be leaked through the gap. Therefore, the outer diameter r1 of the first portion 110a may be adjusted so as to prevent the gap between the connecting pipe 114a and the first portion 110a from being formed.

In example embodiments, the hole of the gas nozzle 110 may be divided into a first hole 111a in the first portion 110a and a second hole 111b in the second portion 110b. The gas pipe 112 may be inserted into the first hole 111a. The second hole 111b may serve as a passageway through which the reaction gases from the gas pipe 112 may pass into the tube 102.

Further, in example embodiments, when the gas pipe 112 may be inserted into the first portion 110a, it may be required to prevent a gap between the first hole 111a and the gas pipe 112 from being formed. Thus, the inner diameter r2 of the first hole 111a may be properly adjusted so as to allow the gas pipe 112 to be tightly inserted into the first hole 111a.

In example embodiments, the second hole 111b in the second portion 110b may correspond to the passageway of the reaction gases. Thus, the inner diameter r4 of the second hole 111b may be greater than the inner diameter r2 of the first hole 111a. That is, the second hole 111b may have a cross-sectional area larger than that of the first hole 111a.

In example embodiments, a sliding protrusion 111c may be formed on an outer lower wall of the second portion 110b in the gas nozzle 110. The sliding protrusion 111c may be combined with the connecting pipe 114a.

In example embodiments, the gas-spraying holes 119 may be formed through the sidewall of the second portion 110b in the gas nozzle 110. The gas-spraying holes 119 may be in fluidic communication with the second hole 111b. The reaction gases may be sprayed from the gas-spraying holes 119 toward the semiconductor substrates W.

In example embodiments, the gas nozzle 110 may include quartz. In some embodiments, the gas nozzle 110 may include silicon carbide (SiC). That is, the gas nozzle 110 may include an easily breakable material.

In example embodiments, the fixing member 114 may include the connecting pipe 114a and a fixing cap 114b. The first portion 110a of the gas nozzle 110 may be inserted into the connecting pipe 114a. The fixing cap 114b may function as to fix the connecting pipe 114a.

In example embodiments, the connecting pipe 114a may have a cylindrical shape. The cylindrical connecting pipe 114a may have an inserting hole through which the first portion 110a of the gas nozzle 110 may be inserted. A sliding groove 115a may be formed at an upper sidewall of the connecting pipe 114a. The sliding protrusion 111c may be combined with the sliding groove 115a. As shown in FIG. 2B, a position of the sliding groove 115a may correspond to that of the sliding protrusion 111c. When the sliding protrusion 111c may be horizontally rotated, the sliding protrusion 111c may be inserted into the sliding groove 115a, so that the gas nozzle 110 may be fixed to the connecting pipe 114a. Further, the connecting pipe 114a may have a hole formed through a lower surface of the connecting pipe 114a. The gas pipe 112 may be inserted through the hole of the connecting pipe 114a.

When the gas nozzle 110 may be combined with the connecting pipe 114a, the fixing cap 114b may firmly secure the sliding protrusion 111c to prevent the sliding protrusion 111c from being moved in the sliding groove 115a. As shown in FIG. 2C, when the gas nozzle 110 may be combined with the connecting pipe 114a, the fixing cap 114b may block a portion of the sliding groove 115a into which the sliding protrusion 111c may not be inserted. In example embodiments, the fixing cap 114b may have an annular shape configured to surround the second portion 110b of the gas nozzle 110. A protrusion inserted into the sliding groove 115a may be formed at the annular fixing cap 114b.

In example embodiments, the fixing member 114 may include the connecting pipe 114a and the fixing cap 114b. Alternatively, the fixing member 114 may include only the connecting pipe 114a.

In example embodiments, the fixing member 114 may be used for suppressing breakage of the lower portion of the gas nozzle 110. Thus, the fixing member 114 may include a material different that of the gas nozzle 110. That is, the fixing member 114 may include nonfragile material. For example, the material of the fixing member 114 may not have thermal deformation, deformation caused by a corrosive gas, etc. Further, contaminants such as particles may not be generated from the material of the fixing member 114. Particularly, the material of the fixing member 114 may not be thermally deformed at a temperature in the batch type apparatus.

In example embodiments, the fixing member 114 may include a metal alloy. For example, the fixing member 114 may include a nickel alloy, a stainless steel, an iron-nickel alloy (Invar), an iron-nickel-cobalt alloy (Kovar), etc. The nickel alloy may include a product name of "hastelloy" or "Inconel".

In example embodiments, the gas pipe 112 may include a horizontal extension 112a and a vertical extension 112b. A bent portion may be formed at an intersected portion between the horizontal extension 112a and the vertical extension 112b. The horizontal extension 112a of the gas pipe 112 may be fixed by the clamping member 116. Thus, the fixing member 114 and the gas nozzle 110 connected to the gas pipe 112 may be installed in the tube 102. Further, the horizontal extension 112a may penetrate from the outside to the inside of the tube 102.

In example embodiments, the vertical extension 112b of the gas pipe 112 may be extended into the gas nozzle 110. The reaction gases may be supplied from an upper end of the vertical extension 112b toward the gas nozzle 110. That is, the vertical extension 112b may be extended in the second hole 111b of the gas nozzle 110 through the hole of the lower surface in the connecting pipe 114a of the fixing member 114 and the first hole 111a of the gas nozzle 110 inserted into the connecting pipe 114a.

In example embodiments, the vertical extension 112b may be tightly inserted into the hole of the lower surface in the connecting pipe 114a of the fixing member 114 and the first hole 111a of the gas nozzle 110 to suppress formations of gaps between the vertical extension 112b and the hole of the connecting pipe 114a and between the vertical extension 112b and the first hole 112b of the gas nozzle 110. Further, the upper end of the vertical extension 112b may be positioned higher than a lower surface of the second hole 111b in the gas nozzle 110.

When the gas nozzle 110, the fixing member 114 and the gas pipe 112 may be employed in the batch type apparatus, the reaction gases from the upper end of the vertical extension 112b may be leaked through the gaps between the gas nozzle 110 and the gas pipe 112 and between the gas nozzle 110 and the connecting pipe 114a. However, because the upper end of the vertical extension 112b of the gas pipe 112 may be located higher than the lower surface of the second hole 111b of the gas nozzle 110, leakage paths of the reaction gases may be elongated to suppress the leakages of the reaction gases. Further, the reaction gases from the upper end of the vertical extension 112b may be directly and continuously supplied to the second portion 110b of the gas nozzle 110. Thus, because a strong upward gas current may be formed in the second portion 110b of the gas nozzle 110, downward streams of the reaction gases may also be suppressed.

In example embodiments, the gas pipe 112 may include a material different from that of the gas nozzle 110. Particularly, the material of the gas pipe 112 may have a characteristic capable of suppressing high stresses at the bent portion. Further, the material of the gas pipe 112 may have high strength. For example, the material of the gas pipe 112 may not have thermal deformation, deformation caused by a corrosive gas, etc. Further, contaminants such as particles may not be generated from the material of the gas pipe 112. Particularly, the material of the gas pipe 112 may not be thermally deformed at a temperature in the batch type apparatus.

In example embodiments, the gas pipe 112 may include a metal alloy. For example, the gas pipe 112 may include a nickel alloy, a stainless steel, an iron-nickel alloy (Invar), an iron-nickel-cobalt alloy (Kovar), etc. The nickel alloy may include a product name of "hastelloy" or "Inconel". The material of the gas pipe 112 may be substantially the same as that of the fixing member 114. Alternatively, the material of the gas pipe 112 may be substantially different from that of the fixing member 114.

In example embodiments, the batch type apparatus may generally have an inner temperature of no less than about 300° C., specifically about 600° C. Thus, an easily thermally deformed O-ring may not be used as a fixing member for fixing the gas nozzle 110. However, the fixing member 114 of this example embodiment may firmly fix the gas nozzle 110 with suppressing of the leakages of the reaction gases between the gas nozzle 110 and the fixing member 114.

As shown in FIGS. 2C and 2D, the gas nozzle 110, the fixing member 114 and the gas pipe 112 may be installed in the batch type apparatus using the clamping member 116.

Figure 3:
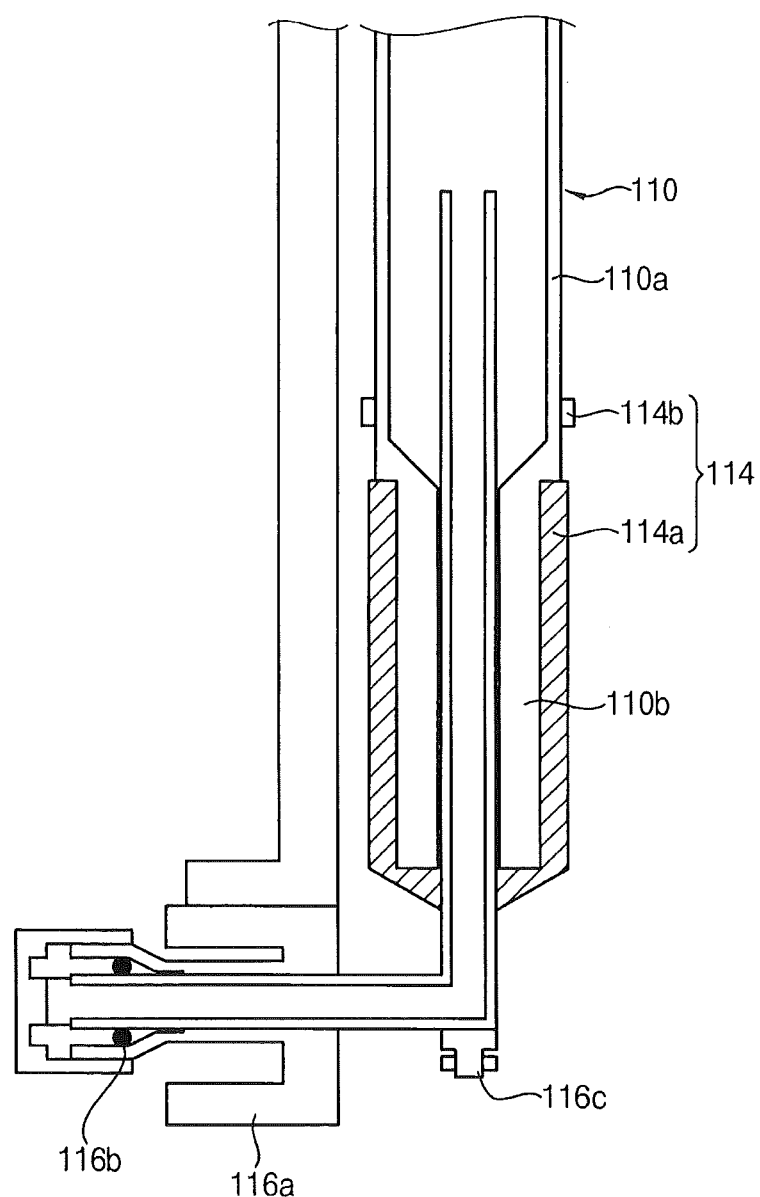

FIG. 3 is a cross-sectional view illustrating the gas nozzle, the fixing member and the gas pipe installed at the apparatus in FIG. 1.

Referring to FIG. 3, the clamping member 116 may include a flange 116a into which the horizontal extension 112a of the gas pipe 112. The flange 116 may have a first fixing portion 116b. The first fixing portion 116b may firmly fix the gas pipe 112. In example embodiments, the first fixing portion 116 may include bolts.

The clamping member 116 may further include a second fixing portion 116c positioned under the bent portion of the gas pipe 112. The second fixing portion 116c may support the gas pipe 112. In example embodiments, the second fixing portion 116c may include a supporting portion and a bolt.

Here, a general gas nozzle may include a fragile material. Further, the general gas nozzle may have a bent portion causing a difficult exchange work of the general gas nozzle. A general gas pipe may have one body. The general gas nozzle and the general gas pipe may include quartz. Particularly, the gas nozzle may be directly combined with a clamping member. These may cause breakages and damages of the gas nozzle.

In contrast, according to this example embodiment, the gas pipe 112 and the fixing member 114 at the bent portion may include the metal alloy having high strength. As mentioned above, a fixing portion by the clamping member 116 may be the sidewall of the gas pipe 112, not the gas nozzle 110. Therefore, breakage of the gas nozzle 110 may be suppressed. Further, an exchange period of the gas nozzle 110 may be elongated, so that a cost for maintaining the batch type apparatus and process failures may be reduced.

Figure 4A:
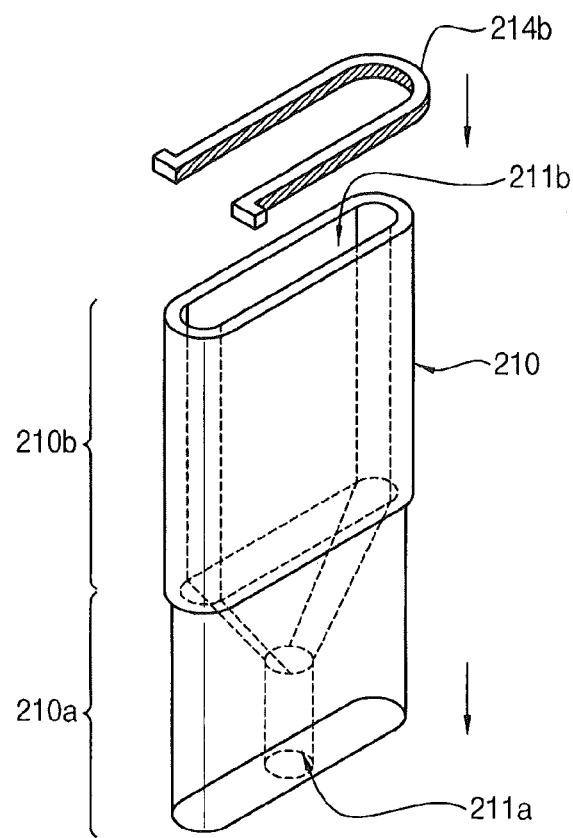
FIG. 4A is an exploded perspective view illustrating a gas nozzle, a fixing member and a gas pipe of a batch type apparatus in accordance with example embodiments.
Figure 4A:
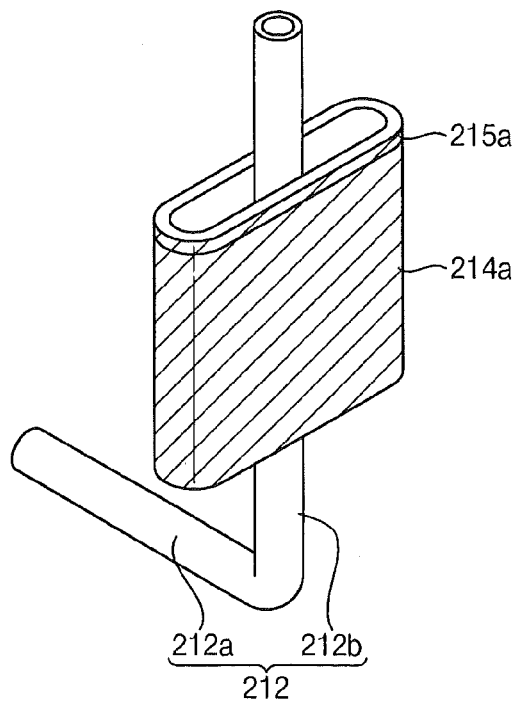
Figure 4B:
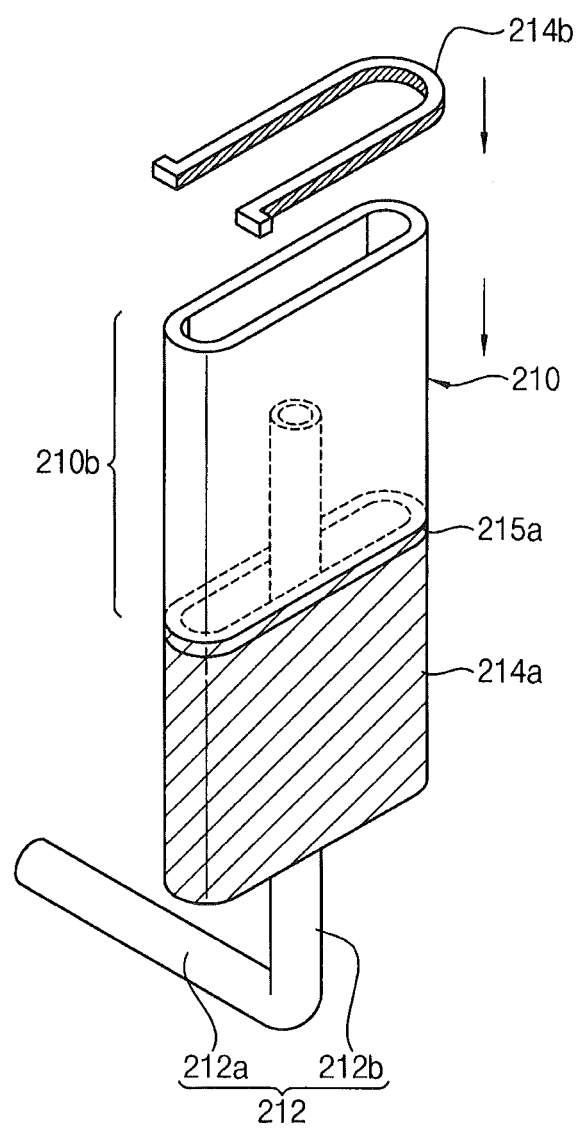
Figure 4C:
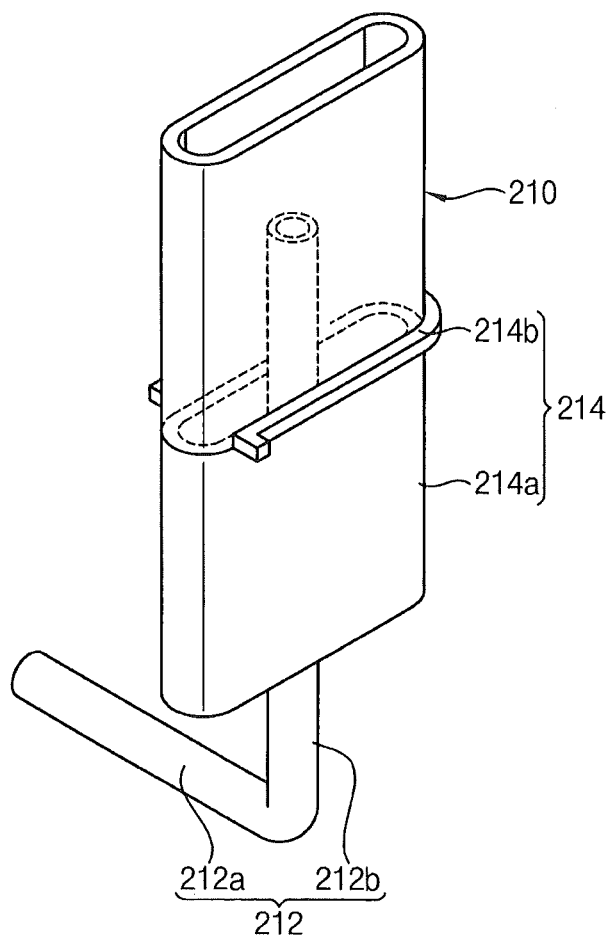

FIG. 4A is an exploded perspective view illustrating a gas nozzle, a fixing member and a gas pipe of a batch type apparatus in accordance with example embodiments, and FIGS. 4B and 4C are perspective views illustrating the gas nozzle, the fixing member and the gas pipe in FIG. 4A.

A batch type apparatus of this example embodiment may include elements substantially the same as those of the batch type apparatus in FIG. 1.

Referring to FIGS. 4A to 4C, a gas nozzle 210 may have a flat cylindrical or oblong shape through a hole may be formed, as illustrated. The gas nozzle 210 may have a vertically linear shape (i.e., the gas nozzle 210 is elongated).

In example embodiments, the shape of the gas nozzle 210 may not be restricted to a specific shape. That is, a cross-section of the gas nozzle 210 may not be restricted within a specific cross-section. For example, the gas nozzle 210 may have a circular cross-section, an elliptical cross-section, etc. In this example embodiment, the gas nozzle 210 in FIGS. 4A to 4C may have an elliptical cross-section.

In example embodiments, the gas nozzle 210 may have a first portion 210a inserted into a connecting pipe 214a of the fixing member 214, and a second portion 210b protruded from the connecting pipe 214a. That is, the first portion 210a of the gas nozzle 210 may correspond to a lower portion of the gas nozzle 210. The second portion 210b of the gas nozzle 210 may correspond to an upper portion of the gas nozzle 210.

In example embodiments, the gas nozzle 210 may have a first hole 211a in the first portion 210a and a second hole 211b in the second portion 210b. The gas pipe 212 may be inserted into the first hole 211a. The second hole 211b may serve as a passageway through which the reaction gases from the gas pipe 212 may pass into the tube 102 (See FIG. 1).

In example embodiments, the first portion 210a may be inserted into the connecting pipe 214a of the fixing member 214. Thus, the first portion 210a may have a cross-sectional area smaller than that of the second portion 210b. Further, it may be required to prevent leakages of the reaction gases through a gap between the connecting pipe 214a and the first portion 210a. Therefore, the cross-sectional area of the first portion 210a may be properly adjusted, so that the first portion 210a may be tightly inserted into the connecting pipe 214a.

In example embodiments, the gas pipe 212 may be inserted into the first hole 211a of the first portion 210a. It may be required to prevent leakages of the reaction gases through a gap between the first hole 211a and the gas pipe 212. Thus, the cross-sectional area of the first hole 211a may be properly adjusted, so that the gas pipe 212 may be tightly inserted into the first hole 211a. Further, the first hole 211a may have a cross-sectional shape substantially the same as that of the gas pipe 212. For example, when the gas pipe 212 may have a circular cross-section, the first hole 211a may also have a circular cross-section.

In contrast, the second hole 211b of the second portion 210b may serve as the passageway of the reaction gases. Thus, the second hole 211b may have a sufficiently large size. That is, the second hole 211b may have a cross-sectional area larger than that of the first hole 211a. Further, the second hole 211b may not have necessarily a cross-sectional shape different from that of the gas pipe 212. Thus, the cross-sectional shape of the second hole 211b may not be restricted within a specific cross-sectional shape. For example, the second hole 211b may have a circular cross-sectional shape, an elliptical cross-sectional shape, etc.

The gas-spraying holes 119 (See FIG. 1) may be formed through a sidewall of the second portion 210b of the gas nozzle 210. The gas-spraying holes 119 may be in fluidic communication with the second hole 211b. The reaction gases may be sprayed from the gas-spraying holes 119 toward the semiconductor substrates W.

In example embodiments, the gas nozzle 210 may include quartz. Alternatively, the gas nozzle 210 may include silicon carbide (SiC). That is, the gas nozzle 210 may include an easily fragile material.

In example embodiments, the fixing member 214 may include the connecting pipe 214a and a fixing clip 214b. The first portion 210a of the gas nozzle 210 may be inserted into the connecting pipe 214a. The fixing clip 214b may function as to fix the connecting pipe 214a.

In example embodiments, the connecting pipe 214a may have a cylindrical shape. The cylindrical connecting pipe 214a may have an inserting hole through which the first portion 210a of the gas nozzle 210 may be inserted. A combining portion 215a may be formed at an upper end of the connecting pipe 214a. The combining portion 215a may make contact with a lower end of the second portion 210b of the gas nozzle 210. Further, the connecting pipe 214a may have a hole formed through a lower surface of the connecting pipe 214a. The gas pipe 212 may be inserted through the hole of the connecting pipe 214a.

When the gas nozzle 210 may be combined with the connecting pipe 214a, the fixing clip 214b may firmly secure the connecting pipe 214 and the gas nozzle 210 to prevent the gas nozzle 210 from being detached from the connecting pipe 214a. The fixing clip 214b may be configured to surround the combining portion 215a of the connecting pipe 214a. Thus, the fixing clip 214b may have a shape corresponding to an outer appearance of the connecting pipe 214a.

In example embodiments, the fixing member 214 may include the connecting pipe 214a and the fixing clip 214b. Alternatively, the fixing member 214 may include only the connecting pipe 214a.

In example embodiments, the fixing member 214 may include a nonfragile material. For example, the material of the fixing member 214 may not have thermal deformation, deformation caused by a corrosive gas, etc. Further, contaminants such as particles may not be generated from the material of the fixing member 214. The fixing member 214 may include a metal alloy. For example, the fixing member 214 may include a nickel alloy, a stainless steel, an iron-nickel alloy (Invar), an iron-nickel-cobalt alloy (Kovar), etc. The nickel alloy may include a product name of "hastelloy" or "Inconel".

In example embodiments, the gas pipe 212 may include a horizontal extension 212a and a vertical extension 212b. A bent portion may be formed at an intersected portion between the horizontal extension 212a and the vertical extension 212b.

In example embodiments, the reaction gases may be supplied from an upper end of the vertical extension 212b toward the semiconductor substrates W in the tube 102. Here, it may be required to suppress leakages of the reaction gases toward the outside of the tube 102. Thus, the vertical extension 212b may be extended in the second hole 211b of the gas nozzle 210 through the hole of the lower surface in the connecting pipe 214a of the fixing member 214 and the first hole 211a of the gas nozzle 210 inserted into the connecting pipe 214a. Further, the vertical extension 212b may be tightly inserted into the hole of the lower surface in the connecting pipe 214a of the fixing member 214 and the first hole 211a of the gas nozzle 210. The upper end of the vertical extension 212b may be positioned higher than a lower surface of the second hole 211b in the gas nozzle 210. Therefore, the reaction gases from the vertical extension 212b may be directly supplied to the second portion 210b of the gas nozzle 210.

In example embodiments, the gas pipe 212 may include a material different from that of the gas nozzle 210. Particularly, the material of the gas pipe 212 may have a characteristic capable of suppressing high stresses at the bent portion. Further, the material of the gas pipe 212 may have high strength. For example, the material of the gas pipe 212 may not have thermal deformation, deformation caused by a corrosive gas, etc. Further, contaminants such as particles may not be generated from the material of the gas pipe 212. The gas pipe 212 may include a metal alloy. For example, the gas pipe 212 may include a nickel alloy, a stainless steel, an iron-nickel alloy (Invar), an iron-nickel-cobalt (Kovar), etc. The nickel alloy may include a product name of "hastelloy" or "Inconel".

According to this example embodiment, the gas pipe 212 and the fixing member 214 at the bent portion may include the second metal alloy having high strength. As mentioned above, a fixing portion by the clamping member 116 may be the sidewall of the gas pipe 212, not the gas nozzle 210. Therefore, breakage of the gas nozzle 210 may be suppressed. Further, an exchange period of the gas nozzle 110 may be elongated, so that a cost for maintaining the batch type apparatus and process failures may be reduced.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A batch type apparatus for manufacturing a semiconductor device, the apparatus comprising:
   a tube;
   a boat configured to receive a plurality of semiconductor substrates, the boat vertically moved into the tube;
   a gas nozzle vertically arranged in the tube, the gas nozzle comprising a first portion and a second portion upwardly extended from the first portion;
   a gas pipe configured to supply reaction gases to the gas nozzle, the gas pipe having a horizontal extension and a vertical extension, and the vertical extension extended in the gas nozzle;
   a fixing member configured to fix the first portion of the gas nozzle to the gas pipe, the fixing member having strength higher than that of the gas nozzle, and the fixing member comprising:
      a connecting pipe configured to receive the gas nozzle; and
      a fixing portion configured to fix the gas nozzle to the connecting pipe and comprising a fixing clip configured to surround the second portion of the gas nozzle; and
   a clamping member configured to clamp the gas pipe to the tube.

2. The batch type apparatus of claim 1, wherein the first portion of the gas nozzle has a cross-sectional area to prevent a gap between the gas nozzle and the fixing member from being formed.

3. The batch type apparatus of claim 1, wherein the first portion of the gas nozzle has a cross-sectional area smaller than that of the second portion of the gas nozzle.

4. The batch type apparatus of claim 1, wherein the first portion of the gas nozzle has a first hole, and the second portion of the gas nozzle has a second hole with a diameter larger than that of the first hole.

5. The batch type apparatus of claim 4, wherein the first hole has the diameter to prevent a gap between the first hole and the gas pipe from being formed.

6. The batch type apparatus of claim 1, wherein the gas pipe has an upper end higher than a lower surface of the second portion of the gas nozzle to directly supply the reaction gases to the second portion of the gas nozzle.

7. The batch type apparatus of claim 1, wherein the fixing member comprises at least one selected from the group consisting of a nickel alloy, a stainless steel, an iron-nickel alloy and an iron-nickel-cobalt alloy.

8. The batch type apparatus of claim 1, wherein the gas pipe comprises a metal alloy having strength higher than that of the gas nozzle.

9. The batch type apparatus of claim 8, wherein the gas pipe comprises at least one selected from the group consisting of a nickel alloy, a stainless steel, an iron-nickel alloy and an iron-nickel-cobalt alloy.

10. The batch type apparatus of claim 1, wherein the gas nozzle comprises quartz or silicon carbide (SiC).

11. The batch type apparatus of claim 7, wherein the clamping member comprises:
    a flange combined with the horizontal extension of the gas pipe; and
    a bolt for fixing the gas pipe.

12. A batch type apparatus for manufacturing a semiconductor device, the apparatus comprising:
    a tube;
    a boat configured to receive a plurality of semiconductor substrates, the boat vertically moved into the tube;
    a gas nozzle vertically arranged in the tube, the gas nozzle comprising a first portion and a second portion upwardly extended from the first portion, and wherein the gas nozzle comprises a sliding protrusion formed at a lower sidewall thereof;
    a gas pipe configured to supply reaction gases to the gas nozzle, the gas pipe having a horizontal extension and a vertical extension, and the vertical extension extended in the gas nozzle;
    a fixing member configured to fix the first portion of the gas nozzle to the gas pipe, the fixing member having strength higher than that of the gas nozzle, wherein the fixing member comprises:
       a connecting pipe configured to receive the gas nozzle and comprising a sliding groove into which the sliding protrusion is inserted; and
       a fixing portion configured to fix the gas nozzle to the connecting pipe and comprising a fixing cap having a ring and a protrusion, the ring configured to surround the gas nozzle, and the protrusion inserted into the sliding groove; and
    a clamping member configured to clamp the gas pipe to the tube.

13. The batch type apparatus of claim 12, wherein the first portion of the gas nozzle has a cross-sectional area to prevent a gap between the gas nozzle and the fixing member from being formed.

14. The batch type apparatus of claim 12, wherein the first portion of the gas nozzle has a cross-sectional area smaller than that of the second portion of the gas nozzle.

15. The batch type apparatus of claim 12, wherein the first portion of the gas nozzle has a first hole with a diameter to prevent a gap between the first hole and the gas pipe from being formed, and the second portion of the gas nozzle has a second hole with a diameter larger than that of the first hole.

16. The batch type apparatus of claim 12, wherein the gas pipe has an upper end higher than a lower surface of the second portion of the gas nozzle to directly supply the reaction gases to the second portion of the gas nozzle.

17. The batch type apparatus of claim 12, wherein the fixing member comprises at least one selected from the group consisting of a nickel alloy, a stainless steel, an iron-nickel alloy and an iron-nickel-cobalt alloy.

18. The batch type apparatus of claim 12, wherein the gas pipe comprises a metal alloy having strength higher than that of the gas nozzle, and wherein the gas pipe comprises at least one selected from the group consisting of a nickel alloy, a stainless steel, an iron-nickel alloy and an iron-nickel-cobalt alloy.

19. The batch type apparatus of claim 12, wherein the gas nozzle comprises quartz or silicon carbide (SiC).

20. The batch type apparatus of claim 12, wherein the clamping member comprises:
    a flange combined with the horizontal extension of the gas pipe; and
    a bolt for fixing the gas pipe.

* * * * *